(12) United States Patent
Alexander et al.

(10) Patent No.: US 7,511,299 B1
(45) Date of Patent: Mar. 31, 2009

(54) PACKAGED INTEGRATED CIRCUIT WITH RAISED TEST POINTS

(75) Inventors: Mark A. Alexander, San Francisco, CA (US); Paul Ying-Fung Wu, Saratoga, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 11/906,669

(22) Filed: Oct. 2, 2007

(51) Int. Cl.
  *H01L 23/58* (2006.01)
(52) U.S. Cl. .......................................... 257/48
(58) Field of Classification Search .................. 257/48, 257/734
  See application file for complete search history.

(56) References Cited

U.S. PATENT DOCUMENTS

| | | | | |
|---|---|---|---|---|
| 4,222,516 | A * | 9/1980 | Badet et al. | 235/492 |
| 6,624,005 | B1 * | 9/2003 | DiCaprio et al. | 438/113 |
| 7,201,327 | B1 * | 4/2007 | Park et al. | 235/492 |
| 7,400,134 | B2 * | 7/2008 | Morishita et al. | 324/158.1 |

* cited by examiner

*Primary Examiner*—Nathan W Ha
(74) *Attorney, Agent, or Firm*—Scott Hewett

(57) ABSTRACT

A packaged integrated circuit ("IC") includes a substrate, an IC die, and a molded plastic lid. A test point standoff is electrically connected to the IC die and extends away from the surface of the package substrate through the molded plastic lid toward the top surface of the molded plastic lid. The top of the test point standoff is below the top surface of the molded plastic lid.

19 Claims, 4 Drawing Sheets

US 7,511,299 B1

PACKAGED INTEGRATED CIRCUIT WITH RAISED TEST POINTS

FIELD OF THE INVENTION

This invention relates generally to integrated circuits, and more particularly to techniques for providing electrical test points to encapsulated integrated circuits.

BACKGROUND OF THE INVENTION

Many integrated circuits ("ICs") are made up of millions of interconnected devices, such as transistors, resistors, capacitors, and diodes, on a single chip of semiconductor substrate. Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable.

ICs have been electrically connected to their packages using wire bonds. Automatic bonding machines are available to quickly and reliably stitch very fine metal wire from bonding pads on the IC to bonding pads on the package base. The bonding pads are usually located on or near the perimeter of the IC to avoid crossing one wire bond with another. While this approach has worked very well for many ICs, including CPLDs, alternative packaging techniques have been developed.

Another type of packing technique is commonly referred to as "flip-chip" bonding. One advantage of flip-chip packaging techniques over wire-bond packaging techniques is that the solder bumps on the IC are not limited to its perimeter. Small solder bumps are formed on the top of the IC in lieu of wire bonding pads around the perimeter of the chip.

Corresponding bump lands are on the top surface of the base of a package. The IC is flipped over and aligned so that the solder bumps match the bump lands. The assembly is then heated to re-flow the solder bumps, which electrically and mechanically attach the flip-chip IC to the base of the package.

The base of the package typically has metal traces that electrically connect the solder targets on the top of the base with contacts on the bottom of the base. In some applications, the traces essentially "spread out" the spacing between the solder targets on the top to another set of solder bumps or pins on the bottom of the package base. This is done to accommodate the generally higher critical dimension (i.e. minimum spacing) of the printed wiring board that the packaged IC is assembled on. In other words, the processes and materials used to fabricate the package base reliably produce more closely spaced solder targets and metal traces than the processes and materials used to fabricate the printed wiring board.

FIG. 1A is a plan view of a prior art flip chip packaged IC 100 without a lid. The lid is omitted in order to show the underlying features of the packaged IC. An IC 102 is mounted on a package substrate 104 with a solder ball array (see FIG. 1B, ref. num. 134) on the IC 102 that mechanically and electrically connects to a corresponding solder land array (see FIG. 1B, ref. num. 136) on the package substrate 104. The package substrate 104 also has solder pads (solder lands) 106, 108 for mounting chip capacitors 110 or other components on the surface of the package substrate 104

Exposed test points (test pads) 112, 114, 116, 118 on the surface of the package substrate 104 provide electrical access to corresponding terminals of the IC 102 through traces 120, 122 for electrical testing of the packaged IC 100. The package substrate 104 has multiple patterned metal layers, and the traces associated with exposed test points 114, 118 are in a lower metal layer, and are not shown. Solder mask 126, 128 is optionally included on spans of the exposed traces 120, 122 to avoid inadvertent shorting to the traces.

FIG. 1B is a cross section of the flip-chip packaged IC 100 of FIG. 1A taken along section line A-A. A metal lid (not shown) is typically attached to the perimeter of the package substrate 104 using any of a variety of techniques (e.g., gluing). The lid protects the surface-mount components and other exposed features from physical damage or inadvertent electrical shorting. A lid can also provide thermal sinking or spreading, and provide additional mechanical strength to the final packaged IC.

In order to reveal the test points on the surface of the package substrate, the metal lid is partially or entirely removed. For example, a glue joint is heated to soften the glue, allowing removal of the lid, or the lid is milled to a thin section that allows peeling of the remaining lid material off, or a window is milled into the lid, allowing electrical test probe access to the exposed test points on the surface of the substrate.

An electronic test probe 130 makes contact to the exposed test point 112, and is electrically coupled through the trace 120 to a solder ball 132 in a solder ball array 134 of the IC 102 to electrically test the IC.

The solder ball array 134 of the IC 102 is mechanically and electrically connected to a corresponding solder land array 136 on the package substrate 104. Patterned metal layers and conductive vias (not shown) in the package substrate 104 electrically connect terminals (i.e., solder balls) of the IC 104 to a second solder ball array 138 on the opposite side of the package substrate 104. The solder ball array 138 of the package substrate is typically connected to a corresponding pattern on a printed wiring board (not shown).

An alternative packaging technique uses a plastic-based molding compound (also commonly called encapsulant) to provide mechanical and environmental protection to packaged ICs. Molded packages are commonly used on relatively small, low-power ICs; however, they are less common on large ICs, such as FPGAs, because the molding compound does not conduct heat as well as a metal lid and does not have as great a thermal capacity, thus providing reduced thermal sinking and thermal spreading compared to a conventional metal lid. Heat sinking and heat spreading are particularly desirable for FPGA and other physically large ICs having high power consumption, such as microprocessors and digital signal processors ("DSPs").

Unfortunately, a molded lid is not removable like a metal lid for contacting the test points on the surface of the package substrate. While it may be possible to selectively mill away the molding compound overlying the test points, it presents practical difficulties in controlling the depth and position of the milling apparatus so as to not damage the surface conductive traces, including surface traces not associated with the test points, and surface components on the package substrate.

What is needed is a means of providing access to test points of a packaged integrated circuit. Such a means should easily allow for such access without damaging the integrated circuit.

SUMMARY OF THE INVENTION

A means of providing access to test points in a packaged integrated circuit is disclosed. The means disclosed allows access relatively easily without damaging the integrated circuit.

A packaged integrated circuit includes a substrate, an IC die, and a molded plastic lid. A test point standoff is electrically connected to the IC die and extends away from the surface of the package substrate through the molded plastic lid toward the top surface of the molded plastic lid. The top of the test point standoff is below the top surface of the molded plastic lid. In a further embodiment, a recess is formed in the molded plastic lid to expose the test point standoff and allow electrical testing of the packaged integrated circuit.

DETAILED DESCRIPTION

Figure 1A:
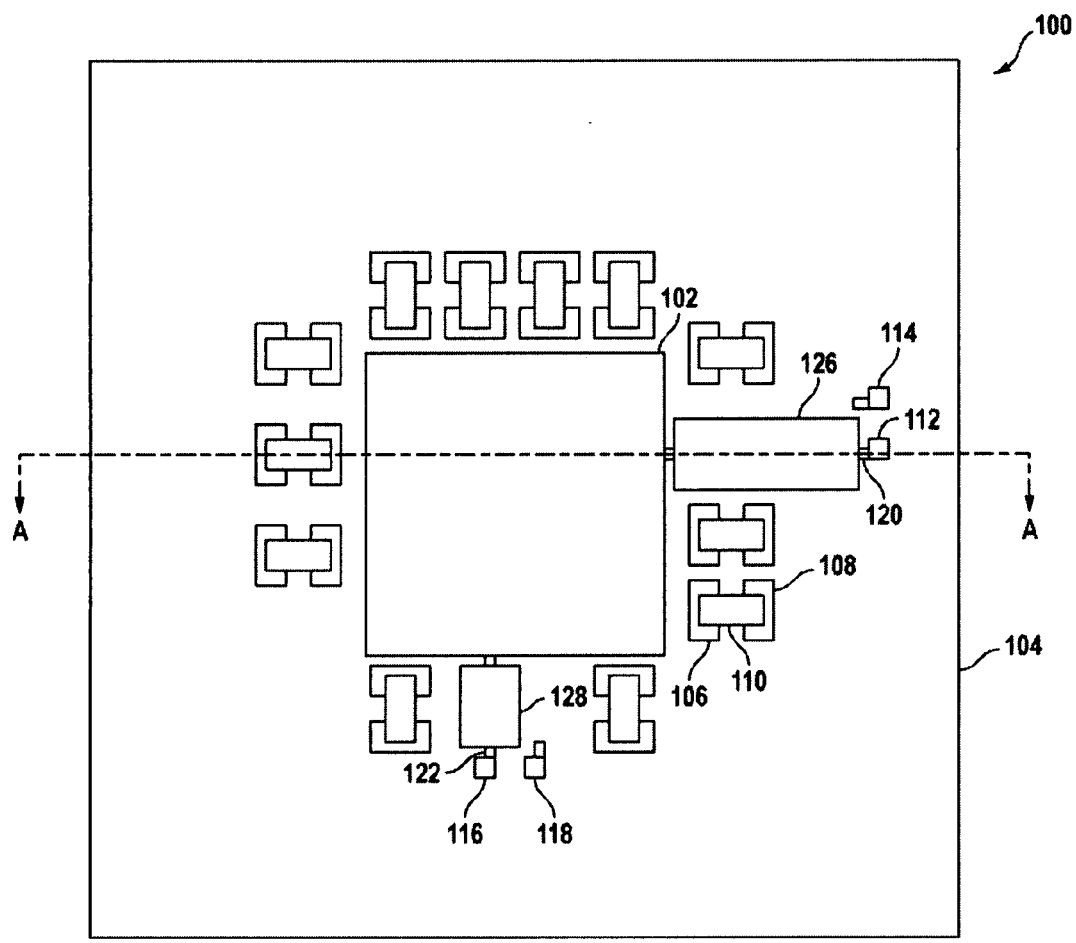
FIG. 1A is a plan view of a prior art flip chip packaged IC.
Figure 1B:
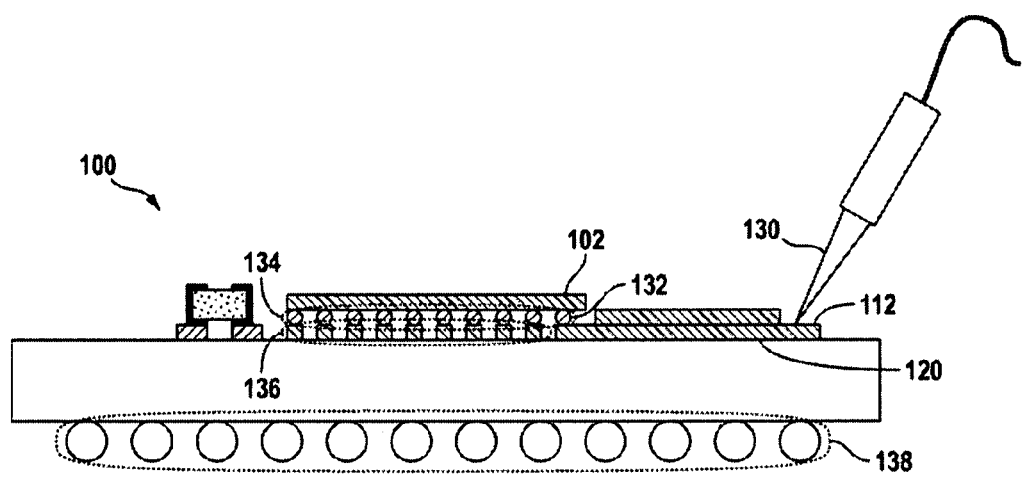
FIG. 1B is a cross section of the flip-chip packaged IC of FIG. 1A taken along section line A-A.
Figure 2A:
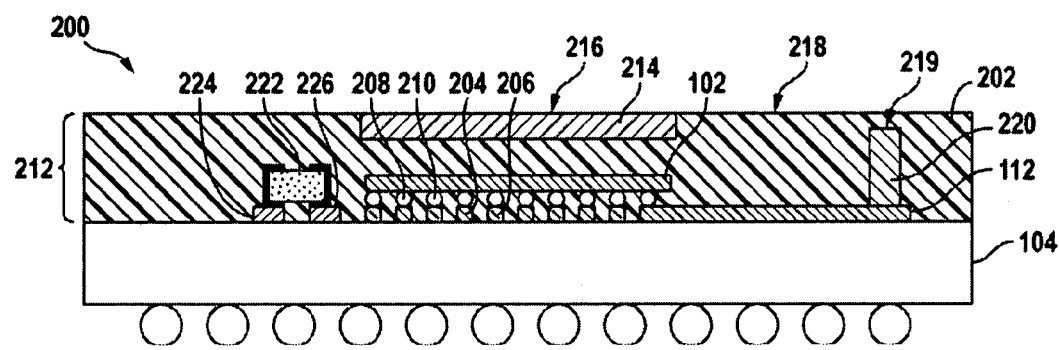
FIG. 2A is a cross section of a packaged IC in accordance with an embodiment of the present invention.

FIG. 2A is a cross section of a packaged IC 200 according to an embodiment. An IC die 102 is electrically coupled to a package substrate 104 with a ball grid array and corresponding solder land array as described above in reference to FIGS. 1A and 1B. Molding compound ("molded lid") 202 encapsulates the IC die 102 and typically flows into the gaps between the solder lands 204, 206 and solder balls 208, 210. The solder balls are shown in cross section without hatching for clarity of illustration. The molding compound is a silica- or glass-loaded epoxy molding compound. Other types of filler, molding or encapsulant compounds suitable for molded under-fill applications are alternatively used. The height 212 of the molding compound depends on several application-specific factors, such as the thickness or the IC die, surface mount components, tooling clearance, and whether a heat slug is to be included, but is typically about 0.3 mm to about 2 mm.

A heat sink 214 (also known as a heat slug or heat spreader) is optionally embedded in the molding compound 202 above the IC die 102. The heat sink is copper or nickel-plated copper, for example. A top surface 216 of the heat sink 214 is even with a top surface 218 of the molded lid 202. The dimensions (footprint) of the heat sink are about the same as the IC die. Alternatively, the footprint of the heat sink is greater than or less than the footprint of the IC die.

An electrical test point standoff 220 extends from the test pad 112 to below the top surface 218 of the molding compound (molded lid) 202. In other words, the top 219 of the test point standoff 220 is below the top 218 of the molding compound. In one embodiment, the electrical test point standoff 220 is a surface mountable conductor (e.g., a small block or cylinder of metal or other conductor) that is soldered to the test pad 112, similarly to how a chip capacitor 222 is soldered to solder lands 224, 226, using surface mount techniques. In an alternative embodiment, a zero-ohm resistor is attached to the substrate during a discrete passive device surface mount process. Solder mask (see FIG. 1A, ref. num. 126) over exposed traces on the surface of the package substrate may be omitted, since the molding compound is not electrically conductive. Standard lidless package substrate assemblies having solder masks are optionally used. In a specific embodiment, the top 219 of the test point standoff is below the top 218 of the molding compound by between about 1% and about 30% of the height 212 of the molding compound. Generally, the top of a test point standoff should be sufficiently below the top of the molding compound so that the overlying molding compound protects the test points from inadvertent electrical damage, such as static discharge.

Most production packaged ICs are shipped with the test point standoffs that are not exposed, as shown in FIG. 2A. The end user would not necessarily even know that the test point standoffs are included in the packaged IC 200. However, if a problem arose, such as a need to access the test point standoffs to measure power system noise of a packaged IC, or PWB board assembly including the packaged IC, a portion of the molded lid material can be selectively removed to expose the test point standoffs. Such techniques are particularly desirable to measure high-frequency noise on a power system while also measuring clock jitter or other functional operating parameters of the packaged IC or PWB.

Figure 2B:
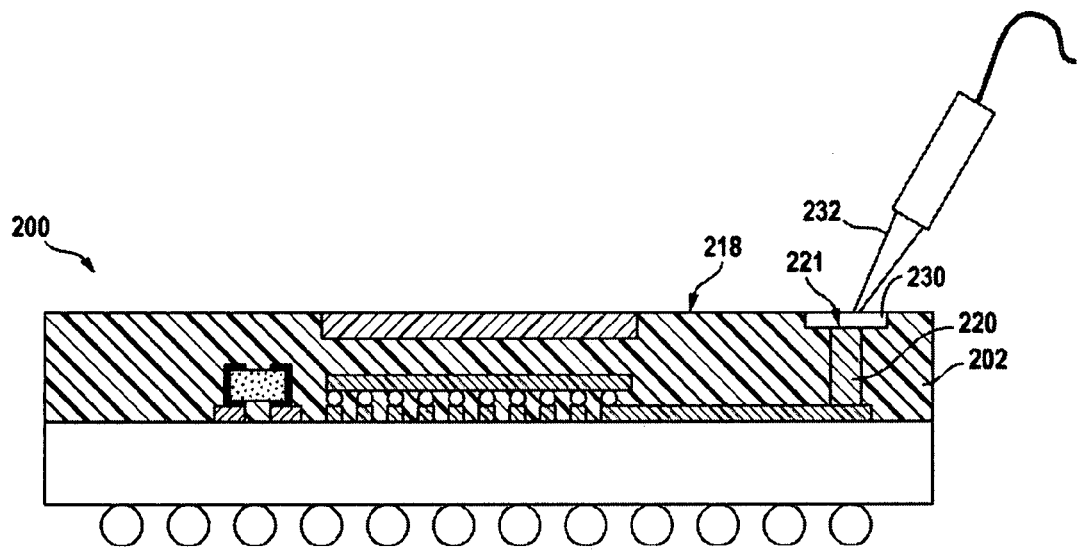
FIG. 2B is a cross section of the packaged IC of FIG. 2A during electrical test in accordance with an embodiment of the present invention.

FIG. 2B is a cross section of the packaged IC of FIG. 2A during electrical test according to a further embodiment. A recess 230 is formed in the packaged IC to expose the test point standoff 220 for electrical testing with a probe 232. In a particular embodiment, the recess 230 is formed by mechanically milling the molding compound and optionally an upper portion of the test point standoff 220 to form a test surface 221 below the top surface 218 of the molding compound 202. In a particular embodiment, the test surface 221 is essentially the same depth as the top of the test point standoff (see FIG. 2A, ref. num. 219). Alternatively, the test surface 221 is lower than the top 219 of the test point standoff due to milling tolerances. In other words, a small amount of the standoff material is removed. It is generally desirable that the depth of the recess provide adequate protection against inadvertent shorting of the test points while allowing easy probe access. Shallower recesses provide less protection against shorting, while deeper recesses are more difficult to probe.

Alternatively, the milling depth is selected to remove a substantial amount of standoff material, and recesses are formed outside of the above range. The molding compound 202 surrounds and supports the test point standoff 220 during the milling process. The test point standoffs allow the milling operation to expose the test surface without damaging pads, traces, or other elements of the packaged IC.

If a test point standoff were omitted on a packaged IC having a molded lid, it would be undesirable to mill the molding compound down to the surface of the package substrate 104 (test pad 112) for several reasons. First, the milling tool might damage adjacent surface mount components or traces on the substrate surface, even if the milling tool is carefully controlled and the part correctly set up in the milling apparatus. If the milling depth were not carefully controlled, the milling tool could remove the test pad and damage underlying layers of the package substrate. If the part were not true (flat and perpendicular to the milling tool) or the part or tool not secured, gouging could occur and damage surface features on the package substrate or underlying layers in the package substrate, rendering the packaged IC unsuitable for testing. Finally, deep milling would make probing more difficult and limit the size of the probe that could reach to the bottom of the molding compound, or require a larger recess be formed to accommodate the desired probe, exacerbating the potential for damage to other surface mount components on the package substrate.

Recessing the test surface 221 below the top surface 218 of the packaged IC 200 protects against inadvertent shorting of the test point standoff 220 during handling and test of the electronic device. Recessing is particularly desirable when a packaged IC has more than one test surface because if multiple test surfaces were brought to the top 218 of the packaged IC, they might short together if they came into contact with a conductive surface during post-milling handling and the electrical testing. Such shorting can cause damage to the packaged IC or other elements of a printed wiring board, electronic device, or test instrument.

Figure 2C:
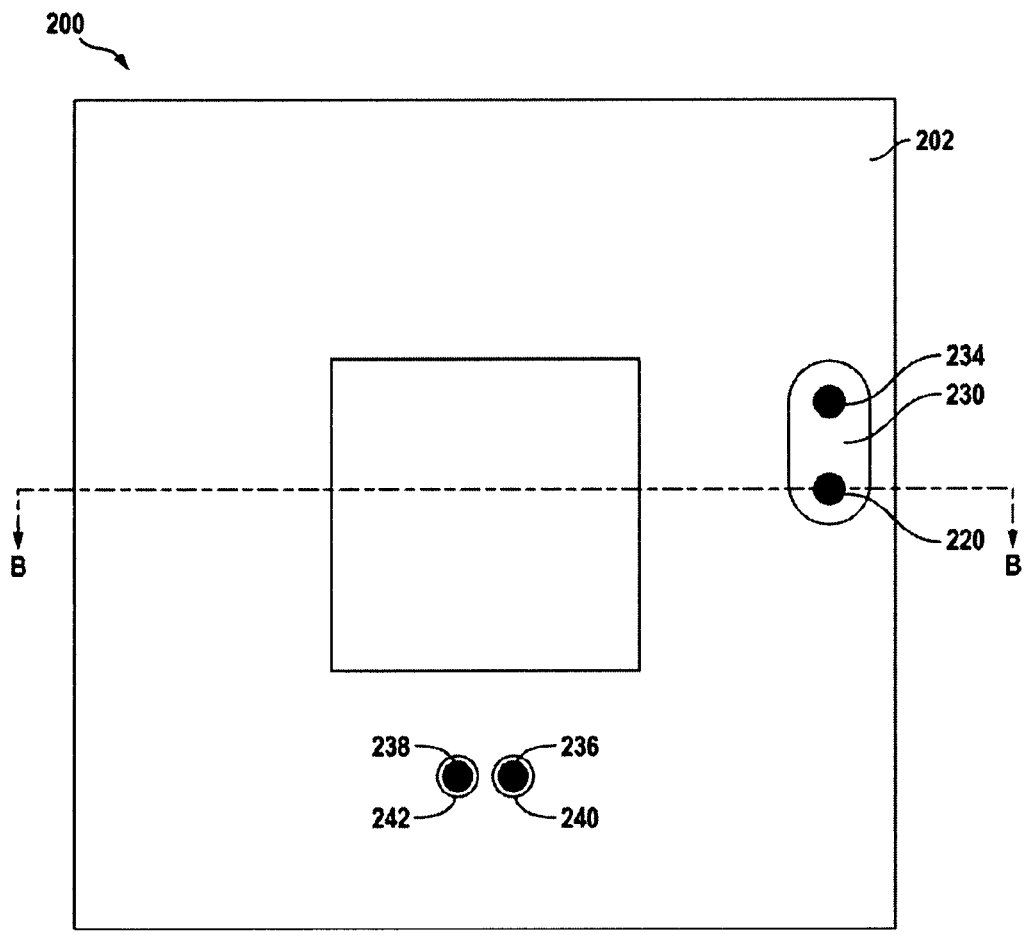
FIG. 2C is a plan view of the packaged IC of FIG. 2B.

FIG. 2C is a plan view of the packaged IC of FIG. 2B. The test point standoff 220 is exposed in the recess 230 milled in the molding compound 202 of the packaged IC 200 to expose the test point standoffs for electrical testing of the packaged IC. The recess 230 is milled to expose a second test point standoff 234. For purposes of convenient discussion, the exposed surfaces of the test point standoffs in the recess will be referred to as "test points". In a particular embodiment, the test point standoff 220 provides an electrical test point to a power pin on the IC (see FIG. 2A, ref. num. 102), such as a pin that provides Vcc or other electrical power to the IC. The second test point standoff 234 provides an electrical test point to a return path (e.g., ground) of the electrical power.

Large ICs, such as FPGAs, DSPs, or microprocessors that consume relatively large amounts of electrical power (compared to a similarly sized random access memory chip, for example) can generate considerable electrical noise that can interfere with or even interrupt operation of the IC. Noise generation and noise susceptibility poses even more of a problem at high operating speeds. In large ICs, 20 Amps, or even as much as 50 Amps, might be switched. Noise generally increases with increasing switched current and faster switching speeds.

In many cases, conventional design and modeling software tools do not provide accurate simulation of power systems for large packaged ICs, or for other packaged ICs having large, rapidly switched currents. It is difficult to measure the power system noise on the external pins (see FIG. 1B, ref. num. 138) of a packaged IC because of the inductance between the IC and the external pin, namely the vias, conductive planes, conductive planelets, or other conductive shapes and power paths in the package substrate. When switching currents in the range of 20 Amps, even a 1 mm structure can provide significant inductance. This inductance can mask high-frequency noise on the IC power system (i.e., power that is supplied to many functional blocks of the IC, such as Vcc).

The effects of the package substrate and associated power path(s) on a power system can be de-embedded from a simulation model of a packaged IC if the measured parameters on both sides of the package substrate are known (measured). Techniques according to the invention allow measuring the power system noise up to very high frequencies, such as about 3.5 GHz, which would contain the seventh harmonic of a 500 MHz data rate, at the exposed test point standoffs. Measuring the power system noise performance at the test point standoffs can accurately represent the performance of the IC power system if the impedance between the IC pin(s) and the test points is controlled. For example, running a power trace having a selected width at a selected distance above a ground plane or between traces coupled to ground can produce a transmission line having a selected characteristic impedance, such as 50 Ohms. If a simple trace were used to couple the IC pin (ball) to the test point, the impedance of the trace might choke (block) the high-frequency components of the IC power system noise, precluding accurate measurement of the high-frequency noise.

The impedance of a power supply structure of a packaged IC is not normally controlled the way high frequency signal traces are. It is generally desirable that power supply structures have a low resistance, typically about 0.1 Ohms or less, to avoid resistive losses and device heating. However, in order to accurately measure the high-frequency noise on a power system, it is desirable to provide a transmission path having a selected characteristic impedance (such as 50 Ohms) between the IC (chip) and the test points (e.g., the exposed ends of test point standoffs 220, 234) that efficiently transmits the high frequency signals of interest (e.g. the high frequency noise) without signal corruption such as reflections from impedance discontinuities.

The test trace, pad, and standoff would create an undesirable stub on a high-frequency path, such as a high-frequency input or output of the device, during normal device operation; however, this problem does not arise when coupled to an IC power system and the impedance-controlled transmission line couples the high-frequency IC power system noise to the test points and does not substantially affect the operation of the packaged IC power system.

After measuring the high-frequency noise components on the IC power system, accurate modeling parameters can be derived for use in an IC simulation to evaluate the performance of the IC under simulated operating conditions. If the tested device is desired to be used in an application, the recess is optionally filled with dielectric (e.g., epoxy resin) or covered with dielectric (e.g., polymer tape) to prevent inadvertent post-test electrical contact (e.g., shorting or static discharge) to the test point(s).

Referring to FIG. 1A, the test points 114 and 112 can be used in a controlled impedance transmission-line structure to couple the test point standoffs 220, 234 of FIG. 2C to the IC. For example, the width of the trace 120 is selected in cooperation with a spacing between the trace and an underlying ground plane (not shown) that is electrically connected to test point 114 to form a microstrip-type transmission line having a selected impedance between the test points and the solder ball 132 of the IC. Other types of transmission lines, such as coplanar-type transmission lines are alternatively formed. Optionally, the dimensions and separation of test point standoff 220 relative to test point standoff 234 can be designed to maintain the selected impedance of the transmission line defined in the package substrate.

Additional test point standoffs 236, 238 (compare FIG. 1A, test points 116, 118) are formed in separate recesses 240, 242. The top surfaces of the test point standoffs are below the top of the molding compound to protect against shorting.

Figure 3:
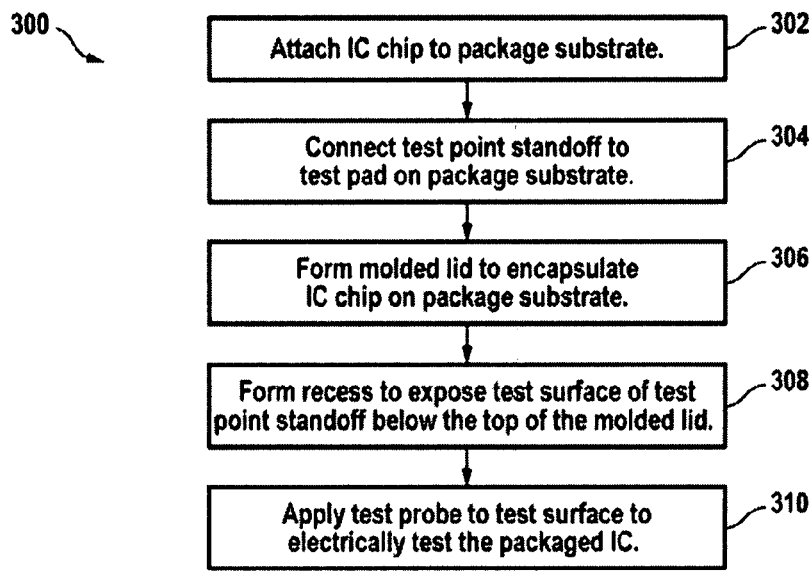
FIG. 3 is a flow chart of a method of packaging an IC in accordance with an embodiment of the present invention.

FIG. 3 is a flow chart of a method of packaging an IC 300 according to an embodiment. An IC chip is attached to a package substrate having a test pad (step 302). In a particular embodiment, the test pad is electrically connected to an IC power system. In a further embodiment, the package substrate has a second test pad, and a transmission structure having a controlled (i.e., selected) impedance extends along the package substrate from the test pads to the IC chip. A test point standoff electrically connected to the test pad is attached to the package substrate (step 304). A molded lid is formed on the package substrate so as to encapsulate the IC chip and the test point standoff (step 306). The top of the test point standoff is below the top of the molded lid. In other words, the top of the test point standoff is covered by a thickness of the molding compound. In a particular embodiment, the molded lid is formed from a plastic IC encapsulant. In a further embodiment, a heat spreader or heat sink is embedded in the molded lid above the IC chip. A recess is formed so as to expose the test point standoff (step 308). The exposed test point standoff is below the top of the molded lid. In a particular embodiment, the recess is formed to also expose a second test point standoff. In an alternative embodiment, a second recess is formed to expose a second test point standoff. A test probe is optionally applied to the test point standoff (step 310) to measure an electrical characteristic of the packaged IC.

Figure 4:
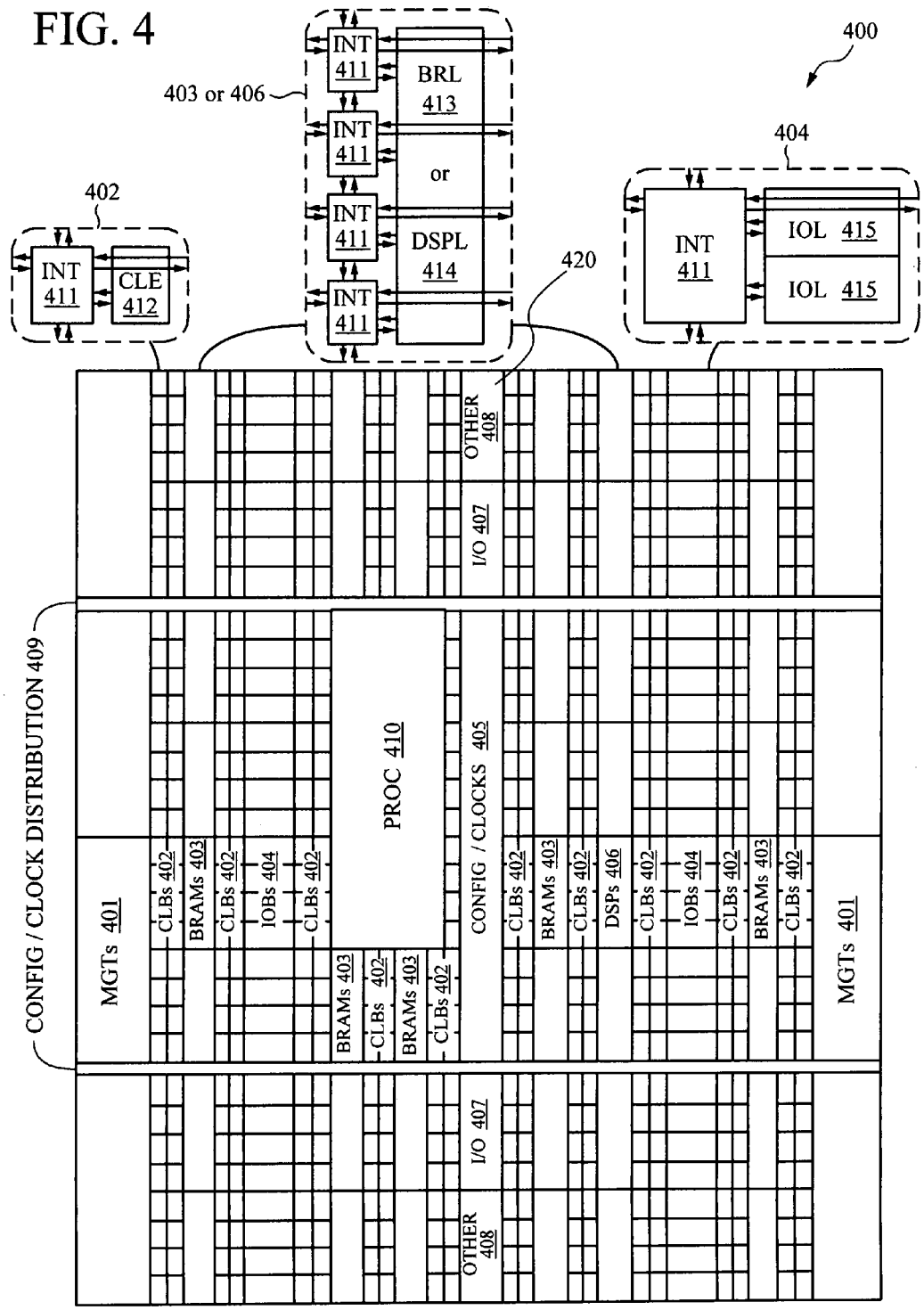
FIG. 4 is a plan view of an FPGA in accordance with an embodiment of the present invention.

FIG. 4 is a plan view of an FPGA according to an embodiment. The FPGA includes CMOS portions in several of the functional blocks, such as in RAM and logic, and is fabricated using a CMOS fabrication process. The FPGA architecture includes a large number of different programmable tiles including multi-gigabit transceivers (MGTs 401), configurable logic blocks (CLBs 402), random access memory blocks (BRAMs 403), input/output blocks (IOBs 404), configuration and clocking logic (CONFIG/CLOCKS 405), digital signal processing blocks (DSPs 406), specialized input/output blocks (I/O 407) (e.g., configuration ports and clock ports), and other programmable logic 408 such as digital clock managers, analog-to-digital converters, system monitoring logic, and so forth. Some FPGAs also include dedicated processor blocks (PROC 410).

In some FPGAs, each programmable tile includes a programmable interconnect element (INT 411) having standardized connections to and from a corresponding interconnect element in each adjacent tile. Therefore, the programmable interconnect elements taken together implement the programmable interconnect structure for the illustrated FPGA. The programmable interconnect element (INT 411) also includes the connections to and from the programmable logic element within the same tile, as shown by the examples included at the top of FIG. 4.

For example, a CLB 402 can include a configurable logic element (CLE 412) that can be programmed to implement user logic plus a single programmable interconnect element (INT 411). A BRAM 403 can include a BRAM logic element (BRL 413) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 406 can include a DSP logic element (DSPL 414) in addition to an appropriate number of programmable interconnect elements. An IOB 404 can include, for example, two instances of an input/output logic element (IOL 415) in addition to one instance of the programmable interconnect element (INT 411). As will be clear to those of skill in the art, the actual I/O pads connected, for example, to the I/O logic element 415 are manufactured using metal layered above the various illustrated logic blocks, and typically are not confined to the area of the input/output logic element 415. In the pictured embodiment, a columnar area near the center of the die (420 in FIG. 4) is used for configuration, clock, and other control logic.

Some FPGAs utilizing the architecture illustrated in FIG. 4 include additional logic blocks that disrupt the regular columnar structure making up a large part of the FPGA. The additional logic blocks can be programmable blocks and/or dedicated logic. For example, the processor block PROC 410 shown in FIG. 4 spans several columns of CLBs and BRAMs.

Embodiments of the invention are particularly desirable for use with packaged FPGAs because FPGAs are highly parallel devices compared to typical microprocessors. That is, entire logic blocks (commonly known as configurable logic blocks, or "CLBs") are typically accessible in an FPGA, and entire blocks or even large groups of blocks may be simultaneously turned on and off. When a CLB is turned on, a relatively large amount of current is briefly drawn by the FPGA, which can cause high frequency noise on the power system. Microprocessors are more "serial" and often have features, such as branch prediction and latency, that affect the types of transitions that can be generated.

Note that FIG. 4 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 4 are purely exemplary. For example, in an actual FPGA more than one adjacent column of CLBs is typically included wherever the CLBs appear, to facilitate the efficient implementation of user logic.

While the present invention has been described in connection with specific embodiments, variations of these embodiments will be obvious to those of ordinary skill in the art. For example, alternative layouts and cross-sections of MOS fuses could be alternatively used, and alternative sensing circuitry can be used. Therefore, the spirit and scope of the appended claims should not be limited to the foregoing description.

What is claimed is:

1. A packaged integrated circuit ("IC") comprising:
 a package substrate having a surface;
 an IC die attached to the surface of the package substrate with a ball grid array;
 a test pad on the package substrate electrically coupled to a ball of the ball grid array;
 a molded plastic lid formed on the package substrate and covering the IC and the test pad, the molded plastic lid having a top surface;
 a test point standoff electrically connected to the test pad and extending away from the surface of the package substrate through the molded plastic lid toward the top surface of the molded plastic lid, a top of the test point standoff being below the top surface of the molded plastic lid.

2. The packaged IC of claim 1 further comprising a recess formed in the molded plastic lid so as to expose a test surface of the test point standoff.

3. The packaged IC of claim 1 further comprising a second test point standoff electrically connected to a second test pad and extending away from the surface of the package substrate through the molded plastic lid toward the top surface of the molded plastic lid.

4. The packaged IC of claim 2 further comprising
 a second test point standoff electrically connected to a second test pad and extending away from the surface of the package substrate through the molded plastic lid toward the top surface of the molded plastic lid; and
 a second recess formed in the molded plastic lid so as to expose a second test surface of the second test point standoff.

5. The packaged IC of claim 2, further comprising
 a second test point standoff electrically connected to a second test pad and extending away from the surface of the package substrate through the molded plastic lid toward the top surface of the molded plastic lid, wherein the recess also exposes a second test surface of the second test point standoff.

6. The packaged IC of claim 3 further comprising a high-frequency transmission line having a selected characteristic impedance between the test pad and the ball.

7. The packaged IC of claim 6 wherein the ball is coupled to a power system of the IC die.

8. The packaged IC of claim 7 wherein the packaged IC is a field-programmable gate array ("FPGA") and the power system switches at least twenty amps of current during operation of the FPGA.

9. The packaged IC of claim 6 wherein the high-frequency transmission line includes a trace forming a microstrip transmission line with a ground plane electrically connected to the second test point standoff.

10. The packaged IC of claim 2 wherein the molded plastic lid has a height, and the top of the test point standoff is between 1% and 30% of the height below the top surface of the molded plastic lid.

11. The packaged IC of claim 1 further comprising a heat spreader disposed in the molded plastic lid.

12. A method of testing an integrated circuit ("IC") comprising:
 attaching an IC chip to a package substrate having a test pad;
 attaching a test point standoff to the test pad;
 forming a molded plastic lid on the package substrate so as to encapsulate the IC chip and the test point standoff;
 forming a recess in the molded plastic lid so as to expose a test surface of the test point standoff below a top surface of the molded plastic lid; and
 applying an electrical test probe to the test surface and to the second test surface so as to measure an electrical characteristic of the IC.

13. The method of claim 12 wherein forming the recess comprises a milling operation.

14. The method of claim 12 wherein attaching the test point standoff comprises a surface mount technique.

15. The method of claim 12 wherein the step of attaching a test point standoff to the test pad further comprises attaching a second test point standoff to a second test pad.

16. The method of claim 15 wherein the step of forming the recess further exposes a second test surface of the second test point standoff.

17. The method of claim 12 wherein the electrical characteristic comprises high-frequency noise on the power system of the IC.

18. The method of claim 17 wherein the test point standoff is electrically coupled to a high-frequency transmission line on the package substrate electrically coupling a power system of the IC to the test point standoff.

19. The method of claim 12 wherein the molded plastic lid has a height and the recess is formed to a depth between 1% and 30% of the height.

* * * * *